United States Patent [19]

Nishizawa et al.

[11] 4,199,771
[45] Apr. 22, 1980

[54] STATIC INDUCTION TRANSISTOR

[75] Inventors: Jun-Ichi Nishizawa, Sendai; Takashi Yoshida, Hamamatsu, both of Japan

[73] Assignee: Nippon Gakki Seizo Kabushiki Kaisha, Hamamatsu, Japan

[21] Appl. No.: 893,537

[22] Filed: Apr. 4, 1978

[30] Foreign Application Priority Data

Apr. 13, 1977 [JP] Japan .............................. 52-41550

[51] Int. Cl.² ........................................... H01L 29/74
[52] U.S. Cl. ...................................... 357/22; 357/55; 357/90
[58] Field of Search .............................. 357/22, 55, 90

[56] References Cited

U.S. PATENT DOCUMENTS

| Re. 28,500 | 7/1975 | Bresee | 357/22 |
|---|---|---|---|
| 2,778,956 | 1/1957 | Dacey | 307/88.5 |
| 3,657,573 | 4/1972 | Maute | 307/304 |
| 3,938,241 | 2/1976 | George | 29/571 |
| 3,968,450 | 7/1976 | Suzuki | 330/15 |
| 3,977,017 | 1/1975 | Ishitani | 35/722 |
| 4,106,044 | 8/1978 | Yoshida | 357/22 |
| 4,115,793 | 9/1978 | Nishizawa | 357/22 |

Primary Examiner—Martin H. Edlow
Attorney, Agent, or Firm—Cushman, Darby & Cushman

[57] ABSTRACT

In a static induction transistor of the type wherein carriers are injected from a source region to a drain region across a potential barrier induced in a current channel, and wherein the height of the potential barrier can be varied in response to a gate bias voltage applied to a gate to thereby control the magnitude of a drain current of the transistor. The product of the channel resistance R c and the true transconductance ($G_m$) of the transistor is maintained less than one and the product of the true transconductance and the series resistance $R_s$ of the transistor is maintained greater than or equal to one in the main operative state of the transistor. The series resistance $R_s$ is the sum of a resistance of the source, a resistance from the source to the current channel, and the channel resistance from the entrance of the current channel to the position of maximum value (extrema point) of the potential barrier in the current channel. This static induction transistor has the advantage that the current-voltage characteristic curve is nearly linear over a very wide range of drain current including the low drain current region.

23 Claims, 17 Drawing Figures

STATIC INDUCTION TRANSISTOR

BACKGROUND OF THE INVENTION (a) Field of the Invention

The present invention pertains to a static induction transistor which exhibits an unsaturated drain current-drain voltage characteristic, and more particularly it pertains to an improvement of the SIT characteristic at low values of the drain current.

(b) Description of the Prior Art

The static induction transistor (SIT), which is a kind of majority carrier injection control device having an unsaturated drain current-drain voltage characteristic similar to the plate current-plate voltage characteristic of triode vacuum tubes, has been proposed in Japanese Patent application No. 46-28405 (the corresponding U.S. Patent application No. 817052) by Jun-ichi NISHIZAWA, one of the present inventors, and in Japanese Patent Application No. 46-57768 (the corresponding U.S. Patent application No. 576541) by Jun-ichi NISHIZAWA et al. The above-mentioned prior art SIT's are designed so that the product of the true transconductance and the series resistance of the SIT may be maintained lower than unity (one) at least in the operational range of low drain current irrespective of the magnitude of the gate voltage. Reference is also made to the Nishizawa U.S. Patent application Ser. No. 757,583 filed Dec. 27, 1976. Reference is also made to the Nishizawa U.S. Patent application Ser. No. 757,583, filed Dec. 27, 1976.

Figure 1:
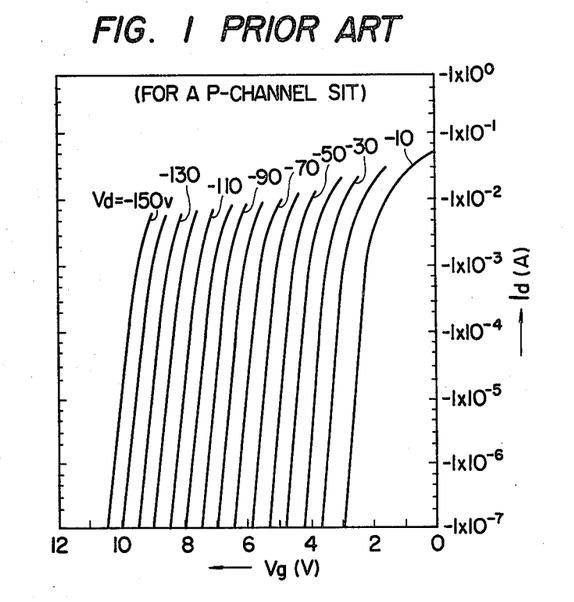
FIGS. 1 and 2 are graphical charts illustrating, in a semi-log scale, a typical example of the drain current-gate voltage characteristic and the drain current-drain voltage characteristic of an SIT according to the prior art, respectively.
Figure 2:
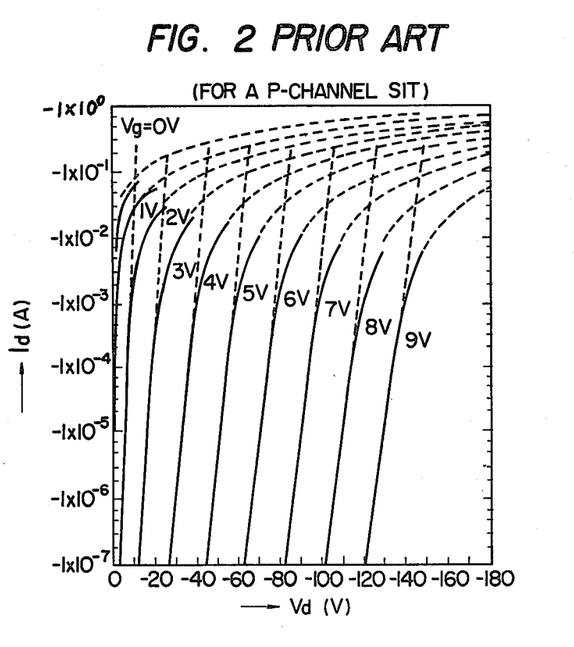

A typical gate voltage-drain current characteristic of the prior art SIT is plotted as the drain current $I_d$ versus the gate voltage $V_g$, with the drain voltage $V_d$ serving as a parameter in a semi-log scale in FIG. 1. The drain current drain voltage characteristic is also plotted as $I_d$ versus $V_d$, with $V_g$ serving as a parameter in a semi-log scale in FIG. 2. In FIG. 2, the dashed portion of characteristic curves is measured by pulse technique. These Figures show the fact that, in the high drain current region, the drain current is nearly proportional to the drain voltage as well as to the gate voltage, but that, in the lower drain current region below approximately $1 \times 10^{-3}$ ampere for this specimen, both the drain current-drain voltage characteristic and the drain current-gate voltage characteristic are governed by an exponential rule. This non-linearity of the prior art SIT's at the low drain current region is considered to be responsible for the non-linear distortion by the SIT in various applications. Accordingly, it is desirable to eliminate the non-linearity in the SIT response.

SUMMARY OF THE INVENTION

It is, therefore, an object of the present invention to provide an improved SIT in which the current-voltage characteristic curve is nearly linear over a very wide range of drain current including the low drain current region.

Another object of the present invention is to provide an improved SIT which is capable of amplifying a signal with reduced non-linear amplification (distortion) and with wider dynamic range.

In order to obtain an SIT which satisfies these requirements, the present inventors have made the following analysis and experiments on prior art SIT's.

In case the current channel of an SIT is rendered pinched-off by only an applied gate voltage, the drain current $I_d$ may be approximately expressed in terms of the gate voltage $V_g$ and drain voltage $V_d$ as:

$$I_d = I_0 \exp\left[-\frac{q}{kT}\eta\{(V_g + \frac{1+\mu}{\mu} r_s I_d) - \frac{V_d}{\mu}\}\right] \quad \text{Eq. 1}$$

wherein q, k and T represent the magnitude of electronic charge, Boltzmann constant and the absolute temperature, respectively. The term $\mu$ represents the voltage amplification factor of the SIT and $\eta$ represents the efficiency of the gate voltage, i.e., the ratio of the potential change at the potential barrier in the channel to the change of the apparent gate voltage. This ratio $\eta$ depends on the geometry and on the impurity profile of the SIT. $I_0$ is a constant which is determined by the geometric structure and the impurity profile the SIT. The term $r_s$ represents the series resistance from the source up to the position of the maximum magnitude (extrema point) of the internal potential barrier. The position of the extrema of potential will hereinafter be referred to as the intrinsic gate of the SIT. The series resistance $r_s$ includes the resistance $R_{sr}$ of the source itself, the resistance $R_{sc}$ from the source to the adjacent end (i.e. the entrance) of the current channel, and the channel resistance $R_c$ from the entrance of the current channel to the intrinsic gate (potential extrema point).

In the low drain current region where the drain current has such a small value that the term $(1+\mu/\mu)r_s I_d$ in Eq. 1 can be neglected as compared with other terms, the drain current may be defined by the following simplified exponential formula, leading to the afore-mentioned exponential increase of the drain current at low values thereof.

$$I_d \approx I_0 \exp\left\{-\frac{q}{kT}\eta(V_g - \frac{V_d}{\mu})\right\} \quad \text{Eq. 2}$$

On the other hand, where the drain current exceeds a certain critical value beyond which the term $(1+\mu/\mu)r_s I_d$ attains a significant value with respect to the gate voltage, the drain current tends to deviate from the exponential relationship of Eqs. 1 and 2. The drain current can thus be expressed, finally leading to be governed by the following linear approximation:

$$I_d \approx \frac{V_d}{(1+\mu)r_s} - \frac{\mu V_g}{(1+\mu)r_s} + I_{const} \quad \text{Eq. 3}$$

where $I_{const}$ is a constant which is determined by the geometry and the impurity profile of the SIT.

It can be noticed from the above discussion that the exponential characteristic of the drain current below the critical value is due to the effect of the series resistance, and that the critical value of the drain current, at which the drain current increment characteristic begins to deviate from the exponential rule into the linear rule, is dependent upon the value of the series resistance. More particularly, the larger the series resistance is, the smaller will be the critical value of the drain current, and vice versa. In other words, if the series resistance has a large (but not too large) value, the critical value of the drain current may become very small compared to the main operative drain currents. This assumption has been roughly confirmed by plotting the current-voltage characteristic of the measurement circuit of FIG. 3 employing a prior art SIT with the product of the series resistance and the true transconductance $G_m$ being kept less than unity within the substantially entire range of the drain voltage and the drain current.

Figure 3:
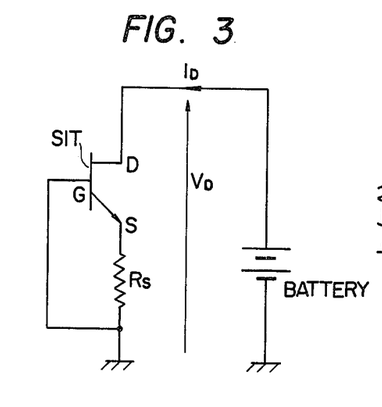
FIG. 3 is an electric circuit diagram showing a circuit employing an SIT of the prior art intended for explanation of the present invention.
Figure 4:
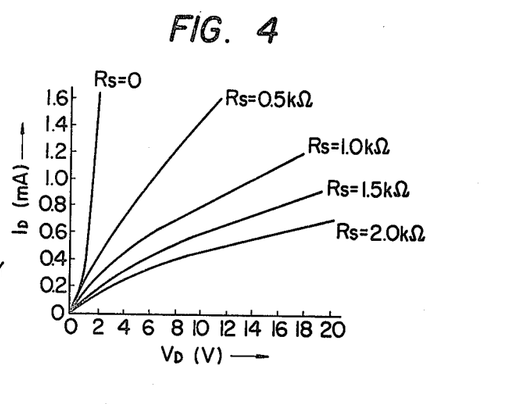
FIG. 4 is a graphical chart illustrating the current-voltage characteristic of the SIT circuit shown in FIG. 3.

In FIG. 3, a n-channel SIT has a drain D connected to the positive terminal of the dc power supply whose negative terminal is grounded, a gate G grounded and a source S grounded through a resistor $R_s$. The current-voltage characteristic of the circuit of FIG. 3 is plotted as current $I_D$ versus voltage $V_D$, with the resistance value of resistor $R_s$ serving as a parameter in a linear scale in FIG. 4. This Figure suggests that the proper determination for the resistance value of the resistor $R_s$ will provide an improved current-voltage characteristic for the circuit shown in FIG. 3 wherein the current $I_D$ of the circuit will make a substantially linear increase in proportion to an increase in the applied voltage $V_D$ of the circuit over a wide current range including a very low current region. In this device, the preferable additional resistance $R_s$ has been pointed out to exist in the range from $0\Omega$ to 0.5 k$\Omega$.

Moreover, the present inventors have made a further analysis on the series resistance $r_s$ in SIT. As previously described, the series resistance $r_s$ is the sum of three component resistances $R_{sr}$, $R_{sc}$ and $R_c$. The value of the resistance $R_{sr}$ is determined mainly by the geometric dimensions and the impurity concentration of the source, and therefore it is independent of the operating condition of SIT. On the other hand, the value of the resistance $R_{sc}$ is somewhat dependent upon the SIT operating condition, because the depletion layer extending from the gate region and defining the current channel is dependent upon the operational condition of the device. When a reverse gate bias or a drain current is increased, the depletion layer grows accordingly to the increased potential difference, and thereby somewhat shortens the source-to-channel region. This shortening of the source-to-channel region leads to a decrease in the source-to-channel resistance $R_{sc}$. In contrast to these two resistances, the value of the channel resistance $R_c$ is very sensitive to the SIT operating condition, and therefore, this channel resistance will widely change in a highly sensitive manner according to the variations of the operating condition. The drain current saturation in conventional field effect transistors may be considered to derive mainly from the feedback effect induced by the channel resistance $R_c$. From this recognition, the condition $r_s \cdot G_m < 1$ for the prior art SIT is construed to be effective for providing the unsaturated drain current-drain voltage characteristic as long as the resistance $R_c$ is sufficiently minimized to provide a negligible extent of the feedback effect onto the operation of SIT.

On the basis of the understanding stated above, the present inventors have come to the conclusion that the conditions of $R_c \cdot G_m < 1$ and $r_s \cdot G_m \geq 1$ are essential to establish the improved SIT of the present. It should be noted that $G_m$ is designated as the true transconductance of SIT.

Accordingly, the SIT of the present invention is characterized in that the value $R_c \cdot G_m$ is maintained less than unity, and also the value $r_s \cdot G_m$ is kept greater than or equal to unity. These conditions hold at least in the low drain current region in the operative state of the SIT. However, if the value $R_c \cdot G_m$ is slightly smaller than unity or comparable with unity in the relatively low drain current region, the value $R_c \cdot G_m$ can become greater than unity in the high drain current region. The true transconductance $G_m$ increases with an increase in the drain current in a unipolar transistor, especially in a static induction transistor. Furthermore, the channel resistance $R_c$ may become large with an increase in the drain current.

In contrast thereto, with the prior art SIT, the first condition $R_c \cdot G_m < 1$ is satisfied, but the second condition $r_s \cdot G_m \geq 1$ is not established.

The relation between the overall apparent transconductance $G_m'$ and transconductance $G_m$ is as follows. The existence of the channel resistance $R_c$, in effect, is reflected in an difference between the apparent and true transconductance of the SIT. The apparent transconductance $G_{mc}$ (considering only the effects of $R_c$, may be expressed as $$G_{mc} = \frac{G_m}{1 + R_c \cdot G_m} \qquad \text{Eq. 4.}$$

The apparent transconductance $G_m'$ further reflects existence of the resistance $R_{sc}$. Where both $R_c$ and $R_{sc}$ are considered, the apparent transconductance $G_{mc}$ may be expressed as:

$$\begin{aligned} G_{ms} &= \frac{G_{mc}}{1 + R_{sc} \cdot G_{mc}} \\ &= \frac{G_m}{1 + (R_{sc} + R_c)G_m} \end{aligned} \qquad \text{Eq. 5,}$$

Finally, the overall apparent transconductance $G_m'$ also accounts for resistance $R_{sr}$:

$$\begin{aligned} G_m' &= \frac{G_{ms}}{1 + R_{sr} \cdot G_{ms}} \\ &= \frac{G_m}{1 + (R_{sr} + R_{sc} + R_c)G_m} \\ &= \frac{G_m}{1 + r_s \cdot G_m} \end{aligned} \qquad \text{Eq. 6.}$$

The source region and the source-to-channel region are non-depleted regions. Therefore, the resistances of these regions are determined mainly by their geometry and resistivity. The resistance of each of these regions becomes high when the cross-section of these regions is made small, the length thereof is made long, and/or the resistivity thereof is made high.

These and other objects as well as the advantageous features of the present invention will become apparent by reading the following description of the preferred embodiments when taken in conjunction with the accompanying drawings.

DETAILED DESCRIPTION OF THE PREFERRED EMBODIMENTS

Figure 5:
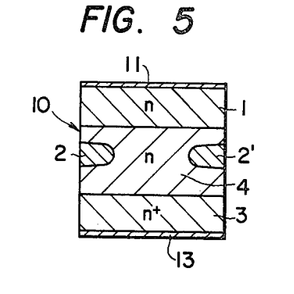
FIGS. 5 through 11 are vertical sections of SIT's of the single-channel type embodying the present invention, respectively.
Figure 6:
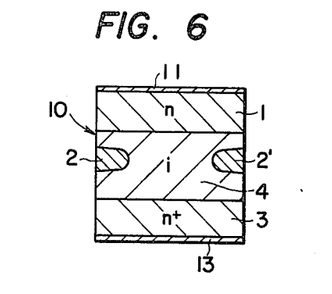

FIGS. 5 and 6 are respectively intended to show, in vertical section, the basic geometric structure of an SIT according to the present invention, which includes a semiconductor crystal 10 (e.g. silicon, germanium and gallium arsenide) comprising a semiconductor layer 1 of a first conductivity type, e.g. n-type, a semiconductor layer 3 of the first conductivity type, and a semiconductor layer 4 of the first conductivity type as shown in FIG. 5 or of the substantially intrinsic type as shown in FIG. 6. On the outer surfaces of the respective layers 1 and 3 are formed a source electrode 11 and a drain electrode 13, thus these layers being operative as a source and a drain of the SIT, respectively. At the opposite sides of the semiconductor layer 4 are provided semiconductor layers 2 and 2' of a second conductivity type, e.g. p-type, which is opposite to the first conductivity type, so as to protrude inwardly to face each other. These semiconductor regions 2 and 2' function as the gates of the SIT, and they may be formed discrete or in a continuous form like a ring shape or a stripe shape, for instance. Gates 2 and 2' define a current channel in the semiconductor layer 4, of the SIT. Gate electrodes which make ohmic contacts to the gates 2 and 2' are not illustrated in FIGS. 5 and 6 for the simplicity of the Figures.

In the known SIT according to the prior art, the source is composed of a relatively heavily impurity-doped material having a ralatively high impurity concentration between the orders of $10^{24}$ and $10^{27}$ atoms/m$^3$ so that the source resistance $R_{sr}$ may be as small as possible and thus satisfies the condition $r_s \cdot G_m < 1$. In contrast thereto, according to the present invention, the source 1 is made of a relatively lightly impurity-doped material having a relatively low impurity concentration between the orders of $10^{21}$ atoms/m$^3$ and $10^{23}$ atoms/m$^3$ so that the source resistance $R_{sr}$ will have a sufficiently large value for satisfying the condition $r_s \cdot G_m \geq 1$. The condition $r_s \cdot G_m \geq 1$ is also satisfied by lengthening the distance from the source to the channel entrance to increase the resistance $R_{sc}$ (and also the resistance $R_c$) and the dependency of the resistances $R_c$ and $R_{sc}$ on the SIT operating condition. In the known SIT the distance from the source to the channel entrance is short enough to keep the value of resistances $R_c$ and $R_{sc}$ small and relatively independent of the SIT operating condition. The resistivity conditions for the gates 2 and 2', the drain 3 and the channel 4 are almost the same as those in the prior art SIT. Accordingly, the gate-constituting material usually has an impurity concentration between the orders of $10^{23}$ atoms/m$^3$ and $10^{27}$ atoms/m$^3$; the drain-constituting material has an impurity concentration between the orders of $10^{23}$ atoms/m$^3$ and $10^{27}$ atoms/m$^3$; and the channel-constituting material has an impurity concentration between the orders of $10^{18}$ atoms/m$^3$ and $10^{22}$ atoms/m$^3$. It should be noted, however, that the impurity concentration for the channel is dependent upon the distance between the gates, the length of the gates along the drain-current-flowing direction, and the operating condition where the SIT is to be used. For a SIT for use in large power applications, the impurity concentration of the channel-constituting material and the gate distance should be determined so that the central portion of the channel is not completely depleted by the diffusion potential of the gates with no gate bias voltage applied.

On the other hand, an SIT of the normally-off type (in which the SIT is in the cut-off state at zero gate bias voltage) the gate distance and the channel impurity concentration should both be determined so that the channel may be completely closed, i.e. pinched off, by the depletion layers produced by the gate to channel diffusion potential extending from the gates. In the latter case, if the channel impurity concentration is set, for instance at $1 \times 10^{19}$ atoms/m$^3$, $1 \times 10^{20}$ atoms/m$^3$ and $1 \times 10^{21}$ atoms/m$^3$, the gate distance may be determined less than 20 μm, 7 μm and 2 μm, respectively. It is needless to say that both the geometric dimensions and the channel impurity concentration must satisfy the above-described condition $R_c \cdot G_m < 1$ at least in the low drain current region in the operative state of the SIT of the present invention.

Figure 7:
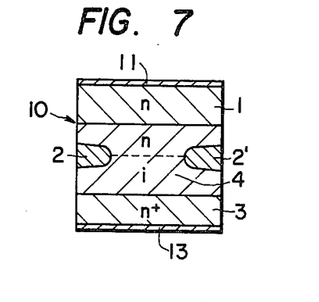
Figure 8:
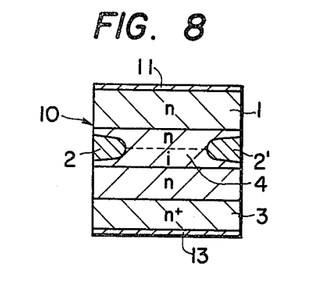
Figure 9:
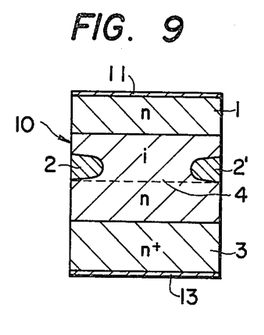
Figure 10:
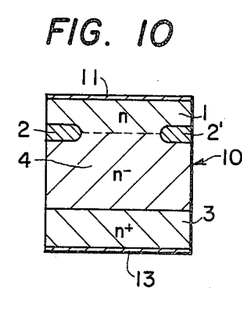
Figure 11:
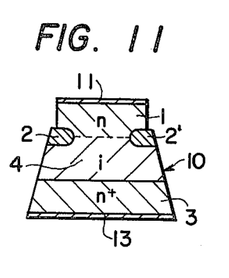

Several possible modifications of the impurity profile in the SIT of the present invention are illustrated in FIGS. 7 through 11. In FIG. 7, the semiconductor layer 4 is formed with a relatively lightly doped n type layer and a substantially intrinsic i type layer. In FIG. 8, the semiconductor layer 4 is composed of a relatively lightly doped n type layer and a substantially intrinsic i type layer, and further, a relatively lightly doped n type layer is inserted between the i type layer and the drain 3. FIG. 9 shows a modification wherein a relatively lightly doped n type layer is provided between the semiconductor layer 4 and the drain 3. In FIGS. 10 and 11, are shown further modifications wherein the gates 2 and 2' are positioned along the boundary between the source 1 and the semiconductor layer 4 (a lightly doped n− type layer in FIG. 10 or intrinsic i type layer in FIG. 11). Moreover, in the SIT shown in FIG. 11, the source 1 is formed smaller in cross section area as compared with that of the semiconductor layer 4, in order to effectively increase the source resistance $R_{sr}$ even for a reduced thickness of the source.

Figure 12:
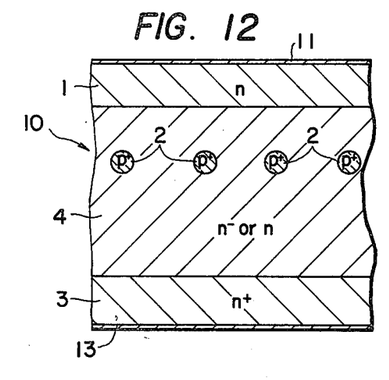
FIGS. 12 through 17 are vertical sections of SIT's of the multi-channel type embodying the present invention, respectively.

A basic geometric structure of the SIT of the multi-channel type according to the present invention is shown in FIG. 12, wherein there is formed mesh-like or grid-like gates 2 with highly impurity-doped semiconductor of the second conductivity type, and wherein a plurality of separated current channels are defined between the adjacent respective gates 2 in the semiconductor layer 4. The geometric dimensions of the respective gates 2, and the impurity concentrations in the source 1 and in the respective current channels are determined in almost the same manner as in the single-channel type SIT described above so that the conditions $r_s \cdot G_m \geq 1$ and $R_c \cdot G_m < 1$ both may be satisfied.

Figure 13:
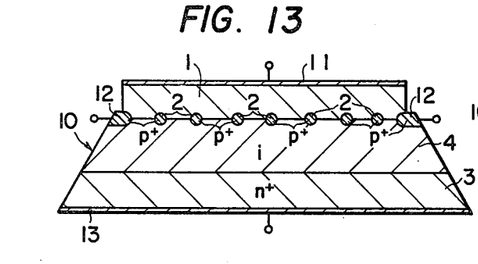

A more practical example of the multi-channel type SIT of the present invention is shown in FIG. 13, wherein a plurality of gates 2 are formed in a line along the boundary between the relatively lightly doped n type layer 1 and the sustantially intrinsic i type layer 4, and wherein the layer 1 which words mainly as the source of the SIT is formed narrower in cross section than the layer 4 so as to attain a higher value of the source resistance $R_{sr}$. All of the gates 2 are formed continuous and led out in common at lead layers 12 provided at the opposite sides of the crystal 10.

A variety of structures of the SIT which are effective for enhancing the source-to-gate breakdown voltage and for decreasing the source-to-gate capacitance will hereinafter be explained with reference to FIGS. 14 through 17.

Figure 14:
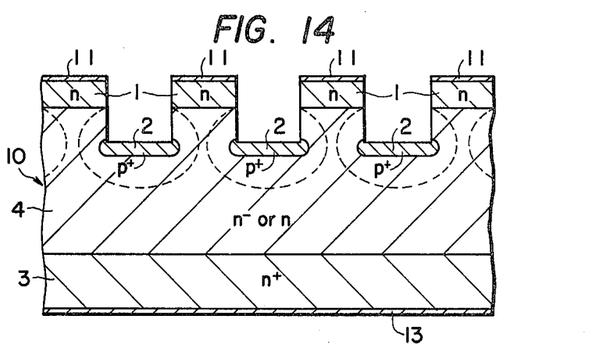

In the SIT shown in FIG. 14, those portions of the source 1 and the layer 4 which are positioned over the respective gates 2 are cut away to make the effective cross sections thereof smaller, thereby increasing the source resistance $R_{sr}$ and the source-to-channel resistance $R_{sc}$ and at the same time for achieving both a reduced source-to-gate capacitance and an increased source-to-gate breakdown voltage.

Figure 15:
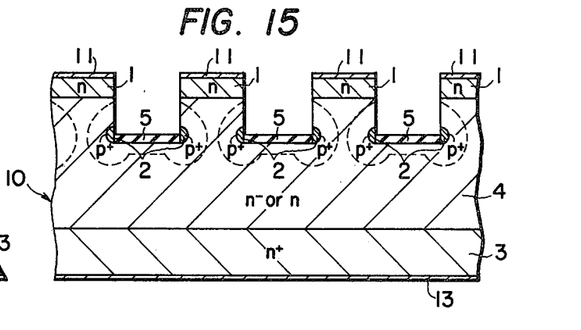

In FIG. 15, exposed portions of the gates 2, excepting the side edge portions of the gates which can be considered to really function as the gates, are cut away, and insulating layers 5 are deposited in place of those cut-away portions, in order to reduce the net area of the gates 2 to thereby futher reduce the source-to-gate capacitance. The other arrangements and the advantages of this example are the same as those of the above-mentioned example in FIG. 14.

Figure 16:
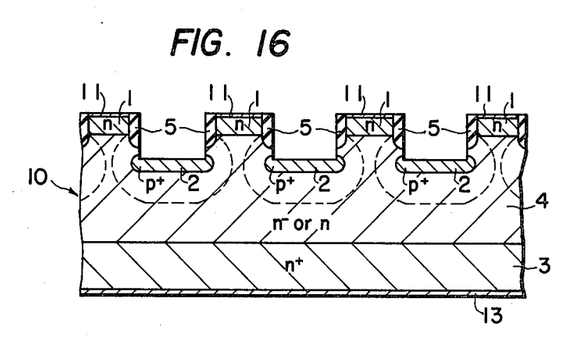

The SIT shown in FIG. 16 is arranged so that the exposed side portions of the source 1 and the exposed top side portions of the layer 4 are cut away and that insulating layers 5 are formed on those cut-away portions. This structure can provide the SIT with a further increased series resistance $r_s$ including the source resistance $R_{sr}$ and the source-to-channel resistance $R_{sc}$. The other arrangements and advantages of this example are the same as those of FIG. 14.

Figure 17:
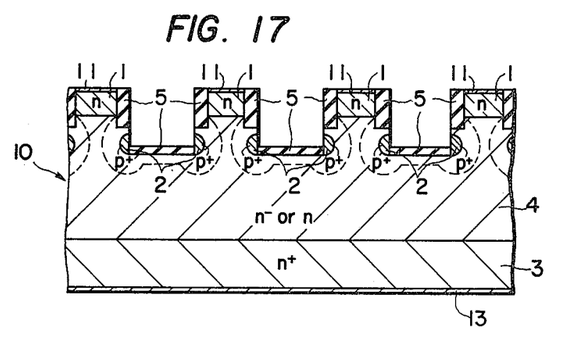

The SIT shown in FIG. 17 is a combination of the arrangements of both examples shown previously in FIGS. 15 and 16.

Throughout FIGS. 14 to 17, the afore-mentioned insulating layers 5 may be formed with any one of insulating materials $SiO_2$, $Si_3N_4$, $Al_2O_3$, and so forth for example, or with a lamination of two or more of these materials. Needless to say, dotted lines in these Figures illustrate the shapes of the depletion layers extending from the respective gates 2 into the current channels when the gates are applied with a certain forward- or reverse- bias voltage. The thicknesses of these depletion layers are controlled to vary in accordance with the gate bias voltage applied, with the result that the heights of the extrema points of potential barriers which are induced in the current channels will change in response to the applied gate bias voltage to control the injection of majority carriers from the source to the drain across the potential barriers in the current channels.

Furthermore, in FIGS. 5 through 17 and in the previous description, symbols i, n, p, $n^-$, $n^+$, $p^+$ are used to mean the following degrees of impurity concentration.

| Symbol | corresponding typical impurity concentration |
|---|---|
| i | about $10^{18}$ atoms/m³ |
| $n^-$ | about $10^{20}$–$10^{21}$ atoms/m² |
| n, p | about $10^{22}$ atoms/m³ |
| $n^+$, $p^+$ | about $10^{24}$–$10^{27}$ atoms/m³ |

Description of the present invention has been made with respect to SIT's of the n-channel type, but it should be understood that the present invention is equally effectively applicable to SIT's of the p-channel type by inverting the conductivity types of all of the semiconductor layers. Also, description of the present invention has been made with respect to junction type SIT's, but it will be easily understood by referring to the previously mentioned references, i.e. U.S. Pat. applications Nos. 817052 and 576541, that the present invention can be equally effectively applied to Schottky gate structure SIT and insulated gate structure SIT (MOS type SIT's).

What is claimed is:
1. In a semiconductor device of the type comprising:
a first semiconductor region of a first conductivity type and having a first predetermined doping characteristic and first predetermined dimensions;
a second semiconductor region of a conductivity type not opposite to said first conductivity type and having a second predetermined doping characteristic and second predetermined dimensions;
a third semiconductor region of said first conductivity type having a third predetermined doping characteristic and third predetermined dimensions;
said first, second and third semiconductor regions being relatively disposed such that said first semiconductor region is adjacent said second semiconductor region and said second semiconductor region is adjacent said third semiconductor region to provide a current path through said first, second and third semiconductor regions; and
gate means, responsive to a bias signal applied thereto, for producing, even at zero value of said bias signal, a depletion layer extending into said second semiconductor region to define a current channel in said second semiconductor region and at least nearly pinch off said current path at a point in said current channel;
said first predetermined doping characteristic and said first predetermined dimensions defining a resistance parameter $R_{sr}$ with respect to the portion of said current path through said first region;
said second predetermined doping characteristic and second predetermined dimensions in conjunction with said gate means defining a resistance parameter $R_{sc}$ with respect to the portion of said current path through said second semiconductor region between said first semiconductor region and the beginning of said current channel along said current path closest to said first semiconductor region and defining a resistance parameter $R_c$ with respect to the portion of said current path through said second semiconductor region between said beginning of said current channel and said point in said current channel whereat said depletion layer at least nearly pinches off said current path;
said device exhibiting an apparent transconductance $G_m'$ related to the true transconductance of said device as $G_m' = G_m/\{1+(R_{sr}+R_{sc})G_m\}$;
the improvement wherein:
said first and second doping characteristics, said first and second dimensions are of values such that, over a substantial portion of the operational range of said device:
the product $R_c \cdot G_m$ is less than unity; and
the product $(R_{sr}+R_{sc}+R_c) \cdot G_m$ is greater than or equal to unity;
whereby said device exhibits a nearly linear current-voltage response.

2. The semiconductor device of claim 1 wherein:
said second semiconductor region has an impurity concentration of less than on the order of $10^{22}$ atoms/m³.

3. The semiconductor device of claim 1 wherein said first semiconductor region has an impurity concentration between on the order of $10^{21}$ atoms/m³ and on the order of $10^{23}$ atoms/m³, said second semiconductor region has an impurity concentration between on the order of $10^{18}$ atoms/m³ and on the order of $10^{22}$ atoms/m³, and said third semiconductor region has an impurity concentration between on the order of $10^{23}$ atoms/m$^3$ and on the order of $10^{27}$ atoms/m$^3$.

4. The semiconductor device of claims 1, 2 or 3, wherein said gate means comprises at least one fourth semiconductor region having a second conductivity type opposite to said first conductivity type, disposed adjacent said second semiconductor region.

5. The semiconductor device of claim 1 wherein said first and second predetermined dimensions are such that the cross section of said first semiconductor region is smaller than the cross section of said second semiconductor region.

6. The semiconductor device of claims 1, 2 or 3, wherein said gate means comprises a pair of semiconductor layers each having a second conductivity type opposite to said first conductivity type disposed at opposite sides of said second semiconductor region.

7. The semiconductor device of claims 1, 2 or 3 wherein said means comprises a plurality of semiconductor fingers of a second conductivity type opposite said first conductivity type disposed spaced apart in said second semiconductor region.

8. In a static induction transistor of the type including:
a first semiconductor region having a low impurity concentration and having a first conductivity type;
a source having a source electrode and a source semiconductor region and a drain having a drain electrode and a drain region, said source semiconductor region and said drain semiconductor region being provided at opposite ends of said first semiconductor region and having said first conductivity type, respectively; and
gate means, disposed adjacent to said first semiconductor region between said source and drain regions, for defining in said first semiconductor region a current channel and producing a potential barrier in said current channel, said current channel having channel dimensions and a channel resistance associated therewith;
said channel resistance being the resistance between one end of said current channel facing said source semiconductor region and the extrema point of said potential barrier in said current channel;
said drain region being responsive to an external voltage applied thereto to cause charge carriers to flow through said current channel from said source semiconductor region to said drain semiconductor region, said gate means being responsive to an external bias voltage applied thereto to vary the height of the extrema point of said potential barrier induced in said current channel so as to control the amount of said carriers injected across said potential barrier from said source region to said drain region;
the improvement wherein:
the impurity concentration of said source semiconductor region is lower than that of said drain semiconductor region; and
each impurity concentration of said semiconductor regions and said channel dimensions are selected so that the product of a channel resistance and a true transconductance of said transistor is maintained less than one (unity) at least in the low drain current channel region in the operative state of said transistor in which state a drain current caused by said carriers reaching said drain region is flowing to provide an unsaturated drain current versus drain voltage characteristic and that the product of a series resistance and said true transconductance of said transistor is maintained not less than one (unity) at least in the low drain current region in said operative state of said transistor; and
said series resistance being the sum of a resistance of said source itself, a resistance from said source to said one end of said current channel and said channel resistance.

9. A static induction transistor according to claim 8 in which:
said first semiconductor region has an impurity concentration less than on the order of $10^{22}$ atoms/m$^3$.

10. A static induction transistor according to claim 8 in which:
said source semiconductor region has an impurity concentration between the orders of $10^{21}$ atoms/m$^3$ and $10^{23}$ atoms/m$^3$, said first semiconductor region has an impurity concentration between the orders of $10^{18}$ atoms/m$^3$ and $10^{22}$ atoms/m$^3$, and said drain semiconductor region has an impurity concentration between the orders of $10^{23}$ atoms/m$^3$ and $10^{27}$ atoms/m$^3$.

11. A static induction transistor according to claim 8, in which: said gate means comprises at least one semiconductor layer having a second conductivity type opposite to said first conductivity type and provided at a side of said semiconductor region.

12. A static induction transistor according to claim 10, in which: said gate means comprises at least one semiconductor layer having a second conductivity type opposite to said first conductivity type and provided at a side of said second semiconductor region.

13. A static induction transistor according to claim 8, in which: said source semiconductor region has an impurity concentration between the orders of $10^{21}$ atoms/m$^3$ and $10^{23}$ atoms/m$^3$, and said gate means comprises at least one second semiconductor region having a second conductivity type opposite to said first conductivity type and positioned along the boundary of said first semiconductor region.

14. A static induction transistor according to claim 13, in which: said source semiconductor region has a cross section area smaller than that of said first semiconductor region.

15. A static induction transistor according to claim 8, in which: said gate means comprises a pair of semiconductor layers each having a second conductivity type opposite to said first conductivity type, these semiconductor layers being provided at opposite sides of said semiconductor region.

16. In a static induction transistor comprising:
a first semiconductor region of a first conductivity type having a first predetermined impurity concentration and first predetermined dimensions;
a source semiconductor region and a drain semiconductor region, both of said first conductivity type, respectively disposed at opposite ends of said first semiconductor region, said source and drain semiconductor regions being of second and third predetermined impurity concentrations and second and third predetermined dimensions, respectively; and
gate means, responsive to gate bias signals applied thereto and including a plurality of semiconductor fingers of a second conductivity type opposite to said first conductivity type, said semiconductor fingers disposed in said first semiconductor region between said source and drain semiconductor regions, for defining a plurality of separated current channels in said first semiconductor region between said fingers and producing potential barriers in said channels, the point of maximum incursion of said potential barriers into said channels being in accordance with said gate bias signals;

said first, source, and drain semiconductor regions and said semiconductor fingers being relatively disposed to provide a flow of carriers through said current channels from said source semiconductor region to said drain semiconductor region in response to a voltage applied to said drain semiconductor region, the amount of carrier flow through said channels being in accordance with the point of maximum incursion of said potential barriers into said channels;

said second predetermined impurity concentration and second predetermined dimensions defining the resistance $R_{sr}$ of said source semiconductor region and said first predetermined impurity concentration and said first predetermined dimensions defining the resistance $R_{sc}$ between said source semiconductor region and a first of the ends of said channels, and further defining the resistance $R_c$ between said first ends of said current channels and the points of maximum incursion of said potential barrier into those current channels;

the improvement wherein:

said first, second, and third predetermined impurity concentrations and said first, second and third predetermined dimensions are such that the product of the true transconductance of said static induction transistor times said resistance $R_c$ is maintained less than unity at least in the low drain current region of the operative state of said transistor, in which state a drain current caused by said carrier flow into said drain semiconductor region flows to provide an unsaturated drain current versus drain voltage characteristic; and the product of said true transconductance of said static induction transistor times the sum of said resistance $R_{sr}$, resistance $R_{sc}$ and resistance $R_c$, is maintained at least equal to unity, at least in the low drain current region of said operative state of said transistor.

17. A static induction transistor according to claim 16, in which: the portion of said first semiconductor region containing said current channels has an impurity concentration less than the order of $10^{22}$ atoms/m$^3$.

18. A static induction transistor according to claim 16, in which: said source semiconductor region has an impurity concentration between the orders of $10^{21}$ atoms/m$^3$ and $10^{23}$ atoms/m$^3$, said fingers of the gate being provided, at an interval therebetween, along the boundary of said semiconductor layer.

19. A static induction transistor according to claim 16, in which: said source semiconductor region has an impurity concentration between the orders of $10^{21}$ atoms/m$^3$ and $10^{23}$ atoms/m$^3$, said first semiconductor region has an impurity concentration between the orders of $10^{18}$ atoms/m$^3$ and $10^{22}$ atoms/m$^3$, and said drain semiconductor region has an impurity concentration between the orders of $10^{23}$ atoms/m$^3$ and $10^{27}$ atoms/m$^3$.

20. A static induction transistor according to claim 19, in which: those portions of both said first and source semiconductor regions which are positioned over said respective fingers of the gate are cut away.

21. A static induction transistor according to claim 16, in which: said gate semiconductor fingers comprises a pair of semiconductor layers of a second conductivity type opposite to said first conductivity type, which semiconductor layers being spaced by an insulator layer.

22. A static induction transistor according to claim 16, in which: said fingers of the gate means are formed in a grid, a mesh, a stripe or like shapes.

23. A static induction transistor according to claim 20, in which: exposed side surfaces of said first and source semiconductor regions above said fingers of the gate are entirely covered by insulator layers respectively, and exposed side surfaces of said first semiconductor layer above said fingers of the gate are covered at portions adjacent to said source semiconductor layer by said respective insulator layers.

* * * * *

UNITED STATES PATENT AND TRADEMARK OFFICE
CERTIFICATE OF CORRECTION

PATENT NO. : 4,199,771
DATED : April 22, 1980
INVENTOR(S) : Jun-ichi NISHIZAWA and Takashi YOSHIDA It is certified that error appears in the above—identified patent and that said Letters Patent is hereby corrected as shown below:

In the heading:

Please add to Item [73] the following omitted Assignee:

--Zaidan Hojin Handotai Kenkyu Shinkokai
Sendai, Japan--

Signed and Sealed this

Eighteenth Day of November 1980

[SEAL]

Attest:

Attesting Officer

SIDNEY A. DIAMOND

Commissioner of Patents and Trademarks

UNITED STATES PATENT AND TRADEMARK OFFICE
CERTIFICATE OF CORRECTION

PATENT NO. : 4,199,771
DATED : April 22, 1980
INVENTOR(S) : Jun-ichi NISHIZAWA and Takashi YOSHIDA It is certified that error appears in the above—identified patent and that said Letters Patent is hereby corrected as shown below:

Column 8:

Claim 1, line 47, change "$G_m' = G_m/\{1 + (R_{sr}+R_{sc})G_m\}$" to -- $G_m' = G_m/\{1 + (R_{sr}+R_{sc}+R_c)G_m\}$ --

Column 9

Claim 8, line 54, correct the spelling of "barrier"

Signed and Sealed this

Twenty-fourth Day of February 1981

[SEAL]

Attest:

RENE D. TEGTMEYER

Attesting Officer  Acting Commissioner of Patents and Trademarks